United States Patent [19]

Chu et al.

[11] Patent Number: 5,021,743
[45] Date of Patent: Jun. 4, 1991

[54] BIASING NETWORKS FOR MATRIX AMPLIFIERS

[75] Inventors: Shiou L. L. Chu, Bedford; Yusuke Tajima, Acton; Manfred J. Schindler, Newton, all of Mass.

[73] Assignee: Raytheon Company, Lexington, Mass.

[21] Appl. No.: 443,985

[22] Filed: Nov. 30, 1989

[51] Int. Cl.$^5$ .............................................. H03F 3/60
[52] U.S. Cl. ..................... 330/54; 330/277; 330/286
[58] Field of Search .......................... 330/54, 277, 286

[56] References Cited

U.S. PATENT DOCUMENTS 4,486,719 12/1984 Ayasli ............................. 330/277 X
4,752,746 6/1988 Niclas .................................. 330/277

OTHER PUBLICATIONS

Design and Performance of a 2-18 GHz Monolithic Matrix Amplifier, A. P. Chang, K. B. Niclas, B. D. Cantos, and W. A. Strifler, IEEE 1989 Microwave and Millimeter-Wave Monolithic Circuits Symposium, pp. 139-141.
The Matrix Amplifier: A High-Gain Module for Multi-octave Frequency Bands, Karl B. Niclas and Ramon R. Pereira, IEEE Transactions on Microwave Theory and Techniques, vol. MTT-35, No. 3, Mar. 1987, pp. 296-306.

Primary Examiner—James B. Mullins
Attorney, Agent, or Firm—Denis G. Maloney; Richard M. Sharkansky

[57] ABSTRACT

A radio frequency matrix amplifier includes an input propagation network for successively connecting input electrodes of a first plurality of transistors. Output electrodes are successively coupled by an intermediate propagation network. The amplifier also includes a second plurality of transistors, having input electrodes successively coupled by the intermediate propagation network and output electrodes successively coupled by an output propagation network. A bias circuit for the amplifier includes an inductor connected between a last one of the second plurality of transistors and the intermediate propagation network and a plurality of capacitors disposed to connect reference electrodes of the second plurality of transistors to a reference potential. With this arrangement stages are connected in series for D.C. potentials and in cascade for r.f. potentials. In a preferred embodiment, capacitors are disposed between the input electrodes of each of the second plurality of transistors and the output electrodes of each of the first plurality of transistors to D.C. isolate the stages, and a voltage divider is disposed between the drain bias terminal and a reference potential for balancing input voltages at each of the inputs of the first plurality of transistors substantially independently of current through the output electrodes of each of the plurality of transistors.

18 Claims, 3 Drawing Sheets

BIASING NETWORKS FOR MATRIX AMPLIFIERS

BACKGROUND OF THE INVENTION

This invention relates generally to radio frequency circuits and more particularly to radio frequency distributed circuits.

As is known in the art, distributed amplifiers are used to amplify broadband radio frequency signals. In general, a distributed amplifier includes a plurality of transistors, an input transmission line to successively couple the input electrodes of the transistors, to an input terminal, and an output transmission line to successively couple the output electrodes of the transistors to an output terminal. The inherent reactance between the input electrode and the reference electrode of each transistors is taken into consideration when designing the input transmission line. By incorporating this inherent reactance into the design of the transmission line, a broadband network is provided. Similarly, the inherent reactance between the output electrode of each transistor and the reference electrode is also taken into consideration when designing the output transmission line to provide a broadband output network. These arrangements enable distributed amplifiers to have very broadband widths. Additive gain is imparted to an input signal fed to the amplifier since the amplifier operates by having successive portions of the signal coupled to the input electrodes. In response at the output electrodes, amplified portions of the successive signal portions are provided. These output signal portions propagate along the output line and add in phase at the output of the amplifier.

One problem with distributed amplifiers is that the additive gain and the power capabilities of distributed amplifiers are limited and often it is necessary to cascade stages distributed amplifiers to improve gain.

A recent solution to the problem of limited power and gain performance of distributed amplifiers is described in U.S. Pat. No. 4,752,767. In this patent, the matrix amplifier is described. In general, the matrix amplifier or matrix distributed amplifier includes a pair (or more) of distributed amplifiers which have the output electrodes of a first one of the distributed amplifiers sharing a common transmission line with the input electrodes of a second one of the distributed amplifiers. Some advantages are provided with this arrangement. For example, higher gain capabilities are possible from a matrixed set of distributed amplifiers. This is because in addition to additive gain provided to an output signal as in the distributed amplifier, multiplicative gain is also provided to the output signal as a result of successive portions of the signal being coupled through cascaded pairs of distributed amplifiers. Further, since each of artificial transmission lines is lossy, and the matrix requires one less line than a conventional cascade, total gain is increased. These advantages are achieved while reducing the size of the circuit. Since such circuits are often formed as monolithic microwave integrated circuits using semiconductor integration techniques, it is desirable to have a smaller circuit since a smaller circuit inter alia will reduce cost and improve yield over a larger circuit.

One problem, however, exists with matrix amplifiers which limits their usefulness. Since the matrix amplifier includes a pair of distributed amplifiers which share a common line, a difficulty arises in providing D.C. bias to the input electrodes of one of the amplifiers and the output electrodes of the other amplifier along the common line. The bias requirements for the input electrodes of transistors are generally different than the bias requirements for the output electrodes of transistors.

In a paper entitled "Design and Performance of a 2-18 GHZ Monolithic Matrix Amplifier" and in the above-mentioned U.S. Patent, bias is supplied to the output electrodes in each transistor of the plurality of transistors by disposing a resistor in series between the reference potential and the reference electrode. There are several disadvantages with this technique. One disadvantage is that the resistance dissipates power during operation of the matrix amplifier. This reduces the efficiency of the matrix amplifier. Further, this arrangement also provides poor gain control, since gate bias is no longer determined by an external gate bias source but rather is determined by the voltage drop across the resistor connected between the reference electrode and the reference potential. This arrangement, accordingly, does not permit flexible adjustment of the gate bias voltage; and moreover, this arrangement may cause problems if there exist minor differences in the gain characteristics of the transistors employed in matrix amplifier.

SUMMARY OF THE INVENTION

In accordance with the present invention, a matrix amplifier includes an input propagation network having a first end coupled to an input terminal of the amplifier. A first plurality of transistors, each transistor having an input electrode and an output electrode, has the input electrode of each transistor successively coupled by the input propagation network. An intermediate propagation network is disposed to successively couple the output electrodes of each one of the first plurality of transistors. A second plurality of transistors with each transistor having an input and an output electrode has the input electrode thereof successively coupled by the intermediate propagation network. An output propagation network is provided to successively couple the output electrodes of the second plurality of transistors and means are provided for biasing the first plurality of transistors and the second plurality of transistors, with said means including means for providing D.C. isolation and an r.f. signal path between a reference potential and a reference electrode of each one of the transistors of the second plurality of transistors, and means including said intermediate propagation network for providing a D.C. current path and an r.f. isolated path between a bias voltage source fed to the second plurality of transistors and a reference return path of each one of the first plurality of transistors. With this particular arrangement, D.C. bias is fed to both pluralities of transistors without the use of resistors connecting in the source or reference electrodes to a reference potential, thus eliminating d.c. power consumption in the D.C. bias network.

In accordance with a further aspect of the present invention, the means for biasing the radio frequency matrix amplifier, further includes, means for providing D.C. isolation between the input electrodes of each one of the second plurality of transistors and the output electrodes of each one of the first plurality of transistors, and a resistor voltage divider network disposed between a D.C. bias voltage and a reference potential for balancing input bias voltages fed to each of the transistors of the first plurality of the transistors and second pluralities of transistors. With this particular arrangement, such a bias network will provide input bias levels which are substantially independent of current fed at the output electrodes of each of the transistors. Furthermore, the bias voltages will also be substantially independent of variations in the d.c. characteristics of the field effect transistors. Thus, this arrangement eliminates d.c. power consumption in the bias network as the prior arrangement, as well as, allows gain control and permits modest variation in-device current.

BRIEF DESCRIPTION OF THE DRAWINGS

The foregoing features of this invention, as well as the invention itself, may be more fully understood from the following detailed description of the drawings, in which.

DESCRIPTION OF PREFERRED EMBODIMENTS

Figure 1:
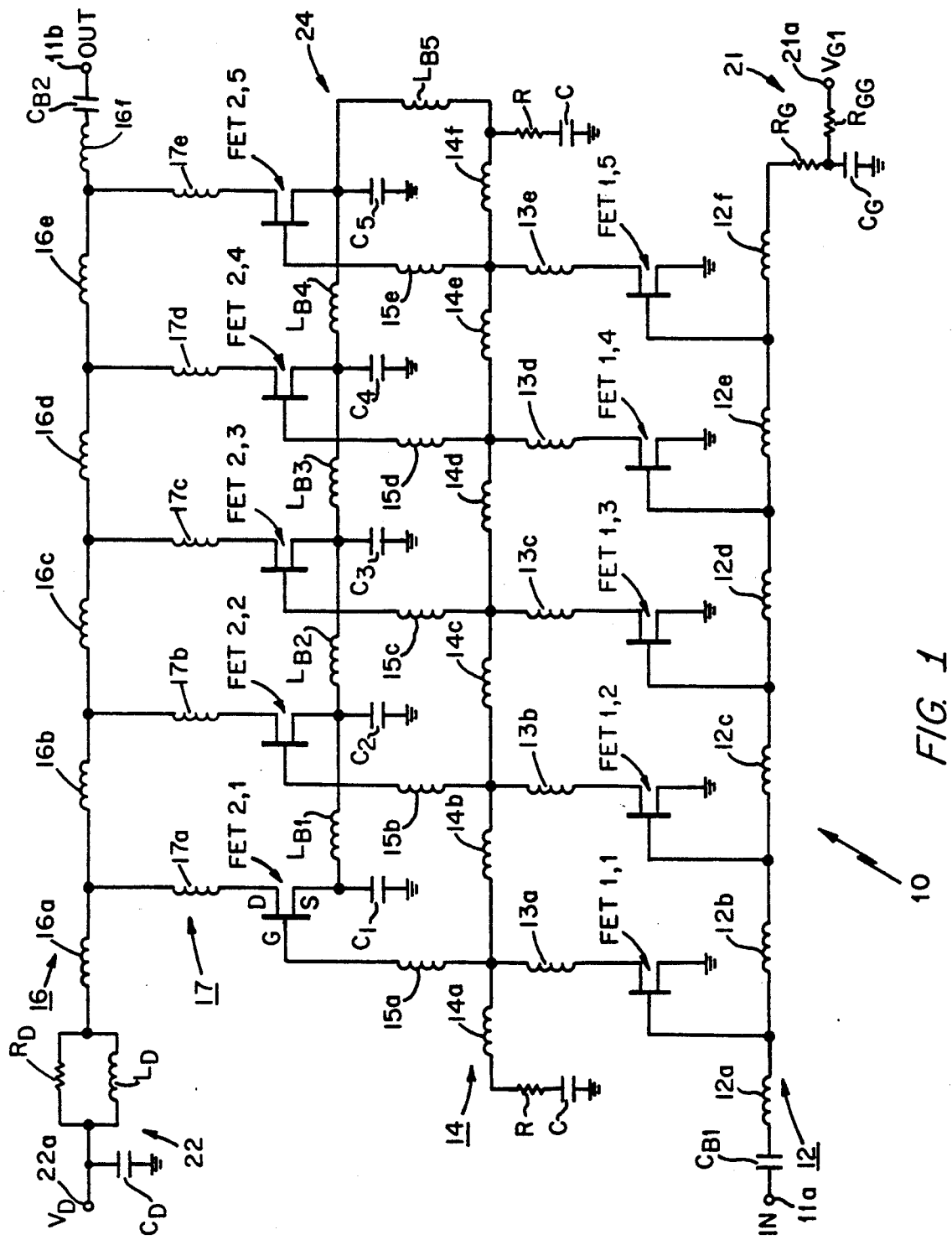
FIG. 1 is a schematic representation of a matrix distributed amplifier having a bias network in accordance with a first aspect of the present invention.

Referring now to FIG. 1, a matrix distributed amplifier 10 having an input terminal 11a and an output terminal 11b is shown to include an input propagation network 12 here comprised of sections 12a-12f of transmission line such as microstrip transmission line or spiral inductors formed using microstrip transmission line techniques. Alternatively, input propagation network 12 maybe comprised of coplanar or other propagation media. The matrix amplifier 10 further includes a first plurality of transistors here field effect transistors FET 1,1-FET 1,5 having input electrodes or gate electrodes G successively coupled by the input propagation network 12 as shown. Output or drain electrodes D of transistors FET 1,1-FET 1,5 are coupled to here respective lengths of transmission line 13a-13e as shown. An intermediate, or common propagation network 14 comprised of transmission line sections 14a-14f is used to successively couple the ends of transmission line sections 13a-13e and thus successively couple the output electrodes to the intermediate propagation network 14. Here intermediate propagation network 14 has disposed at the ends thereof series RC networks which are used to terminate the line in a predetermined characteristic impedance related to the characteristic impedances of transmission line 14, nominally 50 ohms. Alternatively, lower or higher impedance may be selected to tailor amplifier performance characteristics, such as noise figure, power handling, or linearity. The matrix amplifier 10 further includes a second plurality of field effect transistors FET 2,1-FET 2,5 having gate or input electrodes G successively connected by the intermediate propagation network 14 via respective transmission line sections 15a-15e. Transmission lines 15a-15e are optional and are generally used to facilitate circuit layout as an integrated circuit. Source or reference electrodes of transistors FET 2,1-FET 2,5 are coupled to a reference potential, here ground, via capacitors $C_1-C_5$, as shown. Output or drain electrodes of transistors FET 2,1-FET 2,5 are successively coupled by an output propagation network 16 comprised of transmission line sections 16a-16f, as shown. Here the output electrodes are connected to the network 16 via transmission line sections 17a-17e, respectively as shown. The output propagation network 16 has a first end coupled to the output terminal 11b and a second end coupled via network 22 to a drain bias terminal 22a. Drain bias network 22 feeds drain bias voltage to the drain electrodes of the second plurality of FETs, FET 2,1-FET 2,5 is here comprised of a capacitor mounted in shunt between a reference potential and terminal 22 and a series connected resistor $R_D$ shunted by an inductor $L_D$. Other types of bias networks may alternatively be used for network 22. Similarly, the input propagation network 12 is fed a gate bias voltage to bias the gate electrode of the first plurality of FETs, FET 1,1 to FET 1,5 via network 21 which includes a pair of resistors $R_G$, $R_{GG}$ coupled in series between terminal 21a and one end of transmission line section 12f and a capacitor $C_G$ coupled in shunt between the common connection of the resistors $R_G$, $R_{GG}$ and the reference potential.

Figure 1A:
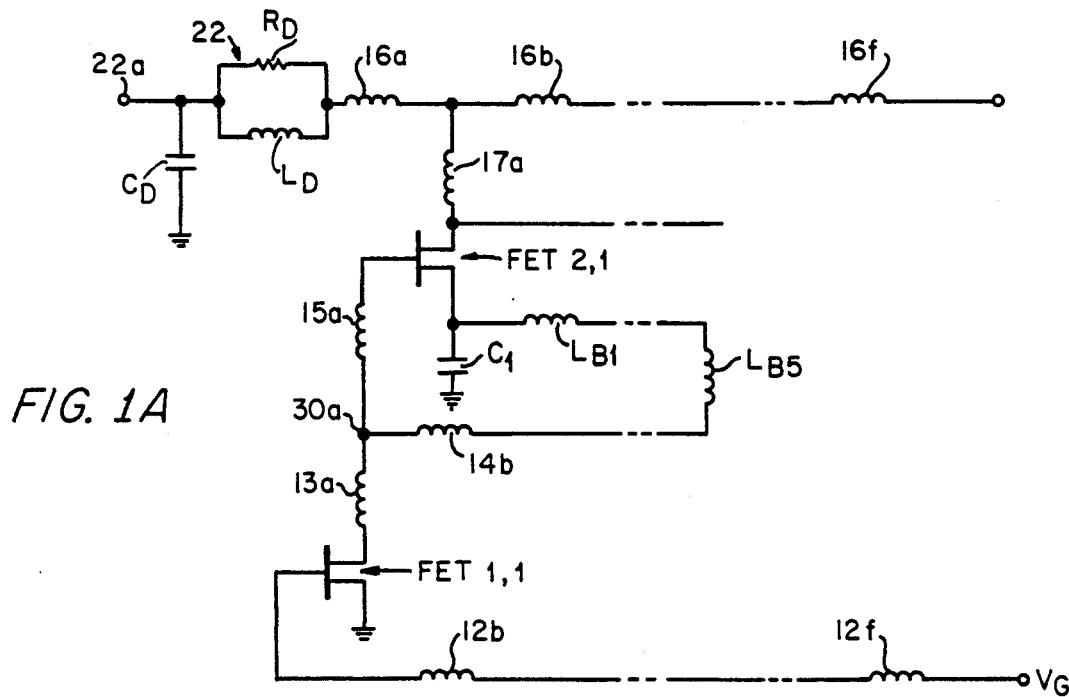
FIG. 1A is a schematic diagram of a portion of FIG. 1 used to explain the function of the bias network.

A network 24 to feed a bias voltage to the gate electrodes of the second set of transistors and drain electrodes of the first set of transistors of matrix amplifier 10, includes an inductor $L_{B5}$ and capacitors $C_1-C_5$. Inductor $L_{B5}$ is coupled between the reference electrode or source electrode of here the last transistor FET 2,5 and the last section 14f of the intermediate propagation network 14, as shown. A D.C. bias, r.f. isolated path is provided, via a inductor $L_{B5}$, through the intermediate transmission line section 14 and thus through transmission line sections 14b-14f and transistors FET 1,1-FET 1,5 since such transistors FET 1,1 to FET 1,5 have source electrodes coupled to a reference potential via a common r.f. and D.C. path, here being directly coupled to the reference potential. Inductor $L_{B5}$ in addition to providing the D.C. bias path or return path for transistors FET 2,1-FET 2,5 also provides r.f. isolation between the first plurality of field effect transistors and the second plurality of field effect transistors. Capacitors $C_1-C_5$ provide D.C. isolation betwen the source electrodes of transistors FET 2,1-FET 2,5 and the reference potential at D.C. voltages. For r.f. potentials the source electrode are connected to the reference potential through capacitors $C_1-C_5$. A further explanation of the biasing circuit, as shown in FIG. 1, is provided in conjunction with FIG. 1A. Here two transistors FET 1,1 and FET 2,1 are shown. The circuit of FIG. 1A is representative of the corresponding portion of circuit FIG. 1 but has been somewhat simplified to aid in the explanation of the bias arrangement. With a drain bias provided at terminal 22a, a drain to source current $I_{DSS}$ flows through transistor FET 2,1. Such current also flows through inductor $L_{B5}$ intermediate propagation network 14 and thus through transistor FET 1,1. Thus, at junction 30a there exist a voltage level which corresponds approximately to one-half of $V_D$ neglecting any resistive losses in the current path. The return path for $I_{DSS}$ is thus through source electrode S of field effect transistor FET 1,1. Similarly, gate bias is provided to transistor FET 2,1 via optional inductor 15a or a direct connection and thus the gate bias $V_G$ at transistor FET 2,1 will be approximately one-half of $V_D$. Since the gate and voltage drain of FET 2,1 are equal, the transistor (FET 1,1 and FET 2,2) must operate at $I_{DSS}$.

Gate bias is provided to transistor 1,1 through network 12 and thus is independently controllable. Thus, this bias network eliminates the need for a resistor in the source connection to the reference potential and thus eliminates the r.f. signal losses associated with such an arrangement. This arrangement, however, is somewhat inflexible in that the drain bias points for both transistor FET 1,1, as well as, FET 2,1 must be equal and at $I_{DSS}$. Such a requirement can only be satisfied if $I_{DSS}$ for FET 1,1 and $I_{DSS}$ for FET 2,1 are equal or nearly equal. Small variations in the d.c. characteristics of the transistors FET 2,1 and FET 1,1 therefore may alter the actual bias point of either of the two transistors from their theoretical bias points. This may cause compression of the transconductance of one or both of the transistors as would be apparent to one of skill in the art. Moreover, the gate bias to transistor FET 2,1 cannot be independently controlled as the gate bias through transistor FET 1,1.

Preferably, inductors $L_{B1}$-$L_{B4}$ are interconnected between adjacent source electrodes S of transistors FET 2,1 -FET 2,5, to inductor LB5 to balance impedance in the amplifier. This may be desirable to improve performance, such as isolation but is not necessary to provide D.C. bias to the gates of the second set of transistors, or drains of the first set of transistors.

Figure 2A:
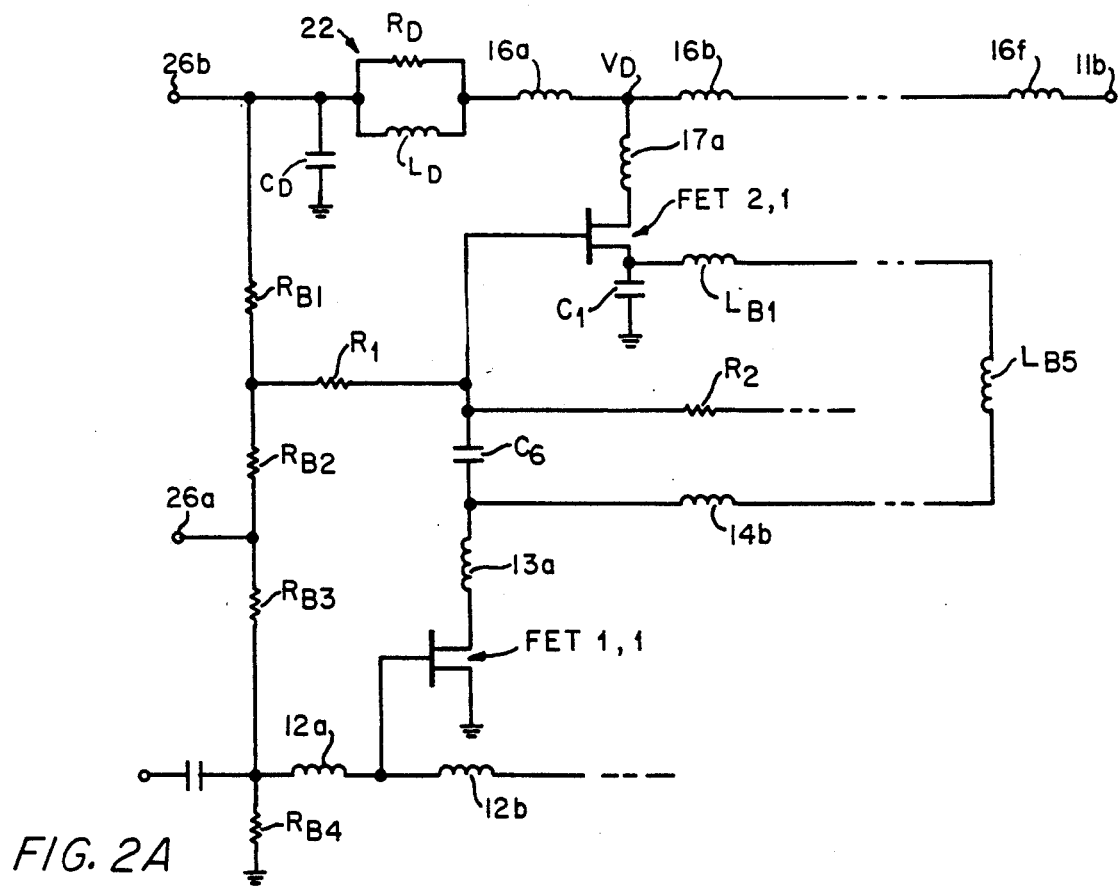
FIG. 2A is a schematic diagram of a portion of FIG. 2 used to explain the bias network of FIG. 2.
Figure 2:
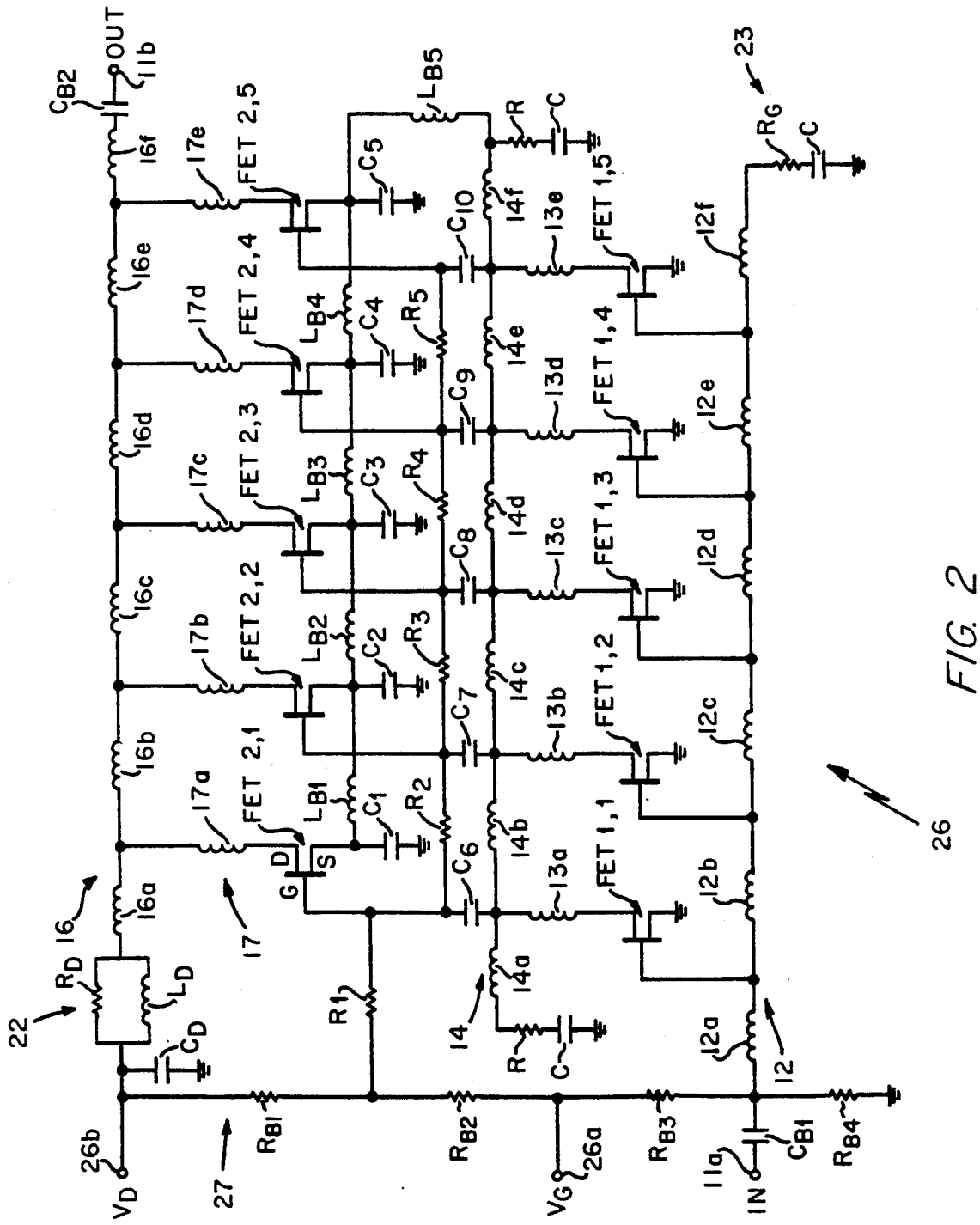
FIG. 2 is a schematic representation of a matrix amplifier having an alternate embodiment of a bias network in accordance with a further aspect of the present invention.

Referring now to FIG. 2, an alternate embodiment of a bias network 26 particularly useful for a matrix amplifier which provides bias potential substantially independent of $I_{DSS}$ is shown to include the input network 12, intermediate propagation network 14 and output propagation network 16 having sections 12a-12f, 14a-14f, and 16a-16f respectively, as described in conjunction with FIG. 1 successively interconnecting a first plurality of transistors FET 1,1-FET 1,5 and second plurality of transistors FET 2,1-FET 2,5 as generally described in conjunction with FIG. 1. The bias network 26 further includes inductor $L_{B5}$ coupled between the reference electrode of the last transistor FET 2,5 of the second plurality of transistors and the intermediate propagation network 14 as also described in conjunction with FIG. 1. Optionally, inductors $L_{B1}$-$L_{B4}$ are also provided as described in conjunction with FIG. 1. Further, capacitors $C_1$-$C_5$ are also disposed between the source electrode of each one of the transistors FET 2,1-FET 2,5 and the reference potential is also described in conjunction with FIG. 1. The bias circuits 26 further include a second plurality of capacitors here $C_6$-$C_{10}$ disposed between the intermediate propagation network 14 and the gate electrodes of the second set of field effect transistors FET 2,1-FET 2,5. Such capacitors provide D.C. isolation for the gate electrodes of the second plurality of transistors from the drain electrodes of the first plurality of transistors. A first plurality of resistors $R_1$-$R_5$ is disposed to successively couple the gate electrodes of each one of the second plurality of field effect transistors FET 2,1-FET 2,5 to a resistive voltage divider network 27, as shown. Resistive voltage divider network 27 here includes four resistors $R_{B1}$-$R_{B4}$ connected in series as shown between the drain bias terminal 26b and a reference potential.

In this arrangement, D.C. drain bias is fed to terminal 26b whereas D.C. gate bias is fed to terminal 26a. The voltage divider network 26 disposed across the pair of pluralities of field effect transistors assists each set or plurality of field effect transistors to operate at the same gate to source voltage. Thus, this arrangement permits the amplifier to operate over a much wider range of gate bias voltages.

Referring now also to FIG. 2A, a detailed explanation of the operation of the bias network 26 will now be provided.

A drain D.C. bias voltage is fed to terminal 26b. This voltage is successively coupled to the drain electrode of each one of the transistors FET 2,1-FET 2,5 (FIG. 2) via network 16. Gate bias voltage $V_{G26b}$ is applied to terminal 26a. The level of D.C. bias for the gate electrodes of each one of the second plurality of transistors is set at $(V_{D26b}-V_{G26a})R_B/2R_B$. Thus the gate bias on the gates of FET 2,1-FET 2,5 is ½ $(V_{D26b}-V_{G26a})$. Drain bias for the drains of FET 1,1-FET 1,5 (FIG. 2) is provided by current $I_{DSS}$ through inductor $L_{B5}$. The nominal value of such drain bias voltage is $V_{D26b}/2$. The gates of FET 1,1-FET 1,5 are biased between the reference potential and V(26a), at a voltage of (V(26a)/2) by resistor $R_B$. The addition of the D.C. isolation capacitors $C_6$-$C_{10}$ decouples the gates of transistors FET 1,1 to FET 1,5 the source potential, thus they need not operate at drain current $I_{DSS}$.

This arrangement allows the gate bias of both sets of FETS to be continually varied for better gain control. The D.C. bias arrangement described above may be extended to matrix amplifiers having more than two stages, for example, addition of capacitors $C_1$-$C_5$ and inductor $L_{B5}$ to decouple the drain electrodes of one stage to the gate electrode of a preceding stage may be used to interconnect second and third stages.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A radio frequency matrix amplifier comprising:
    an input propagation network having a first end coupled to an input terminal of the amplifier;
    a first plurality of transistors, each transistor having an input electrode and an output electrode, with the input electrode of each transistor being successively coupled by said input propagation network;
    an intermediate propagation network disposed to successively couple the output electrode of each one of the first plurality of transistors;
    a second plurality of transistors, each transistors having an input electrode, a reference electrode, and an output electrode with the input electrode of each of the second plurality of transistors being successively coupled by the intermediate propagation network;
    an output propagation network having a first end coupled to the output terminal of the circuit and a second end coupled to a bias terminal, being disposed to successively couple the output electrode of each one of the second plurality of transistors; and
    means for connecting the first plurality of transistors with the second plurality of transistors in series for D.C. voltage potentials and in cascade for r.f. voltage potentials.

2. The matrix amplifier as recited in claim 1 wherein the means includes means for providing D.C. isolation and a radio frequency path between a reference potential and the reference electrode of each one of the second plurality of transistors; and means including said intermediate propagation network for providing a D.C. current path and a r.f. isolation path between the reference electrode of one of said second plurality of transistors and the output electrodes of each of the first plurality of transistors.

3. The matrix amplifier of claim 2 wherein the D.C. isolation means is a second plurality of capacitors disposed to couple the reference electrode of each one of the second plurality of transistors to a reference potential.

4. The matrix amplifier of claim 3 wherein the means for providing a D.C. current path and an r.f. isolation path includes an inductor connected in series between the reference electrode of a last one of the second plurality of transistors and the intermediate propagation network.

5. The matrix amplifier of claim 4 wherein the means for providing a D.C. current path and an r.f. isolation path further includes a plurality of inductors each one connected between corresponding adjacent pairs of reference electrodes of the second plurality of transistors, with a last one of such inductors being connected to the inductor connected in series between the reference electrode of the last one of the second plurality of transistors and the intermediate propagation network.

6. The matrix amplifier of claim 1 further comprising means for balancing input electrode bias voltages applied to each set of the pluralities of transistors; and means for D.C. isolating and r.f. coupling the input electrodes of the second plurality of transistors with the output electrodes of the first plurality of transistors.

7. The matrix amplifier of claim 6 wherein the balancing means includes a resistive voltage divider network connected between a reference potential and the output propagation network.

8. The matrix amplifier of claim 7 wherein the balancing means further includes means, coupled to the voltage divider, for feeding input electrode bias to the input electrodes of each one of the second plurality of transistors.

9. The matrix amplifier of claim 8 wherein the resistive voltage divider network includes four resistors each having substantially the same value of resistance, said resistors being connected in series; and
    wherein the means for feeding input electrode bias includes a plurality of resistors disposed to successively interconnect the input electrodes of the second plurality of transistors, having a first end of a first one of said resistors connected to the common connector of a first one of the resistors of the voltage divider network and a second one of the resistors of the voltage divider network, with said first resistor of the voltage divider network further being connected to an output electrode bias.

10. The matrix amplifier of claim 9 wherein an input electrode bias terminal is provided at the connection of the second and a third resistor of the voltage divider, with a second end of such third resistor connected to the input propagation network.

11. The matrix amplifier of claim 10 wherein a fourth one of the resistors of the voltage divider network is coupled between the reference potential and the input propagation network.

12. The matrix amplifier as recited in claim 6 further comprising means for providing D.C. isolation and a radio frequency path between a reference potential and the reference electrode of each one of the second plurality of transistors further includes: means including said intermediate propagation network for providing a D.C. current path and a r.f. isolation path between the reference electrode of one of said second plurality of transistors and the output electrodes of each of the first plurality of transistors.

13. The matrix amplifier of claim 12 wherein the D.C. isolation means is a plurality of capacitors disposed to couple the reference electrode of each one of the second plurality of transistors to the reference potential.

14. The matrix amplifier of claim 13 wherein the means for providing a D.C. current path and an r.f. isolation path includes an inductor connected in series between the reference electrode of a last one of the second plurality of transistors and the intermediate propagation network.

15. The matrix amplifier of claim 14 wherein the means for providing a D.C. current path and an r.f. isolation path further includes a plurality of inductors each one connected between corresponding adjacent pairs of reference electrodes of the second plurality of transistors, with a last one of such inductors being connected to the inductor connected in series between the reference electrode of the last one of the second plurality of transistors and the intermediate propagation network.

16. A radio frequency matrix amplifier comprising:
    an input propagation network having a first end coupled to an input terminal of the amplifier;
    a first plurality of transistors, each transistor having an input electrode and an output electrode, with the input electrode of each transistor being successively coupled by said input propagation network;
    an intermediate propagation network disposed to successively couple the output electrode of each one of the first plurality of transistors;
    a second plurality of transistors, each transistors having an input electrode, a reference electrode, and an output electrode with the input electrode of each of the second plurality of transistors being successively coupled by the intermediate propagation network;
    an output propagation network having a first end coupled to the output terminal of the circuit and a second end coupled to a bias terminal, being disposed to successively couple the output electrode to each of the second plurality of transistors;
    means for connecting the first plurality of transistors with the second plurality of transistors in series for D.C. potentials and in cascade for r.f. potentials;
    means for providing D.C. isolation between the input electrodes of each of the second plurality of transistors and the output electrodes of each of the first plurality of transistors; and
    voltage divider means disposed between the bias terminal and a reference potential for balancing bias voltages at each input electrode of the first plurality of transistors substantially independently of bias current fed from the reference electrode of each of the second plurality of transistors.

17. The amplifier of claim 16 wherein said means for connecting includes an inductor connected to a last one of the transistors of the second plurality of transistors and the intermediate propagation network; and
    a plurality of capacitors disposed to connect the reference electrodes of each one of the second plurality of transistors to the reference potential.

18. The amplifier of claim 17 where said D.C. isolation means includes a plurality of capacitors each one coupled between the output electrodes of the first plurality of transistors and the input electrodes of the second plurality of transistors.

* * * * *